(12) United States Patent
Honda et al.

(10) Patent No.: US 6,680,007 B2
(45) Date of Patent: Jan. 20, 2004

(54) CONDUCTIVE RESIN COMPOSITIONS AND ELECTRONIC PARTS USING THE SAME

(75) Inventors: Tsuyoshi Honda, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/235,507

(22) Filed: Sep. 6, 2002

(65) Prior Publication Data

US 2003/0078322 A1 Apr. 24, 2003

(30) Foreign Application Priority Data

Sep. 6, 2001 (JP) .......................... 2001-269998

(51) Int. Cl.$^7$ ..................... C09J 183/04; C09J 163/02; C09J 163/04; C09J 8/02; H01L 23/29
(52) U.S. Cl. ..................... 252/511; 252/500; 252/511; 428/620; 523/400; 523/205; 523/466; 528/33; 257/778
(58) Field of Search ................. 252/500, 511; 523/400, 205, 466; 428/620; 257/778; 528/33

(56) References Cited

U.S. PATENT DOCUMENTS 6,225,704 B1 * 5/2001 Sumita et al. .............. 257/789
2002/0140093 A1 * 10/2002 Yamazaki et al. .......... 257/734

FOREIGN PATENT DOCUMENTS

JP 2000-256642 * 9/2000 .......... C09J/183/04

* cited by examiner

*Primary Examiner*—Yogendra N. Gupta
*Assistant Examiner*—Kallambella Vijayakumar
(74) *Attorney, Agent, or Firm*—Birch, Stewart, Kolasch & Birch, LLP.

(57) ABSTRACT

A conductive resin composition comprising (A) an epoxy resin, (B) a phenolic resin, (C) a curing accelerator, and (D) a conductive filler is provided wherein component (A) and/or (B) is a copolymer obtained by reacting an epoxy resin or phenolic resin with an organopolysiloxane, the organopolysiloxane component in the cured composition does not form a phase separation structure, and a weight ratio of (D) to (A) plus (B) is in the range: $300/100 \leq D/(A+B) \leq 1500/100$. It possesses adhesion, heat resistance, moisture resistance, flexibility and impact resistance.

10 Claims, No Drawings

CONDUCTIVE RESIN COMPOSITIONS AND ELECTRONIC PARTS USING THE SAME

This invention relates to conductive resin compositions having both the adherent, heat resistant and moisture resistant properties of epoxy and phenolic resins and the flexible and impact resistant properties of silicone resins and suitable for use in electrical and mechanical connection of electronic parts as a substitute for the existing solder and conductive resin compositions; and electronic parts using the same.

BACKGROUND OF THE INVENTION

For the electrical and mechanical connection of electronic parts, solders and low-melting alloys are now widely used as well as conductive resin compositions of a thermosetting resin loaded with a conductive filler such as silver powder.

In most solders, lead is added in order to lower the melting point, which is against the current prevailing climate aiming for environmental protection. The abolition of leaded solder is being proposed in many countries. In combination with solder, a flux based on higher fatty acid is often used to help the solder bond to substrates and chips, which complicates the assembly operation of electronic parts.

Known conductive resin compositions include amine cure type epoxy resins and addition cure type silicone resins. Of these, the amine cure type epoxy resins can cure at a low temperature within a short time into cured products which have a high glass transition temperature and heat resistance, but are undesirably rigid and brittle. Additionally, since the cured epoxy resins do not fully absorb stresses generated at the bond interface to electronic parts, there is a risk that in a thermal cycling test or thermal shock test, cracks and other defects may develop in the electronic parts or the cured resins. The amine curing agents are more hygroscopic than phenolic curing agents and have a risk that in a moisture resistant reliability test, they may cause corrosion to electrodes and conductors and other undesired problems.

On the other hand, the addition cure type silicone resins cure into flexible products which can absorb stresses, but are less adherent and less heat resistant than the epoxy resins. There is a risk of cured silicone resins arising undesired problems such as interfacial separation after they are allowed to stand at elevated temperatures. Curing accelerators commonly used in silicone resin compositions, typically platinum compounds have the drawback that curing reaction is substantially retarded by inhibitors having an unshared electron pair such as nitrogen, phosphorus and sulfur.

SUMMARY OF THE INVENTION

An object of the present invention is to provide a conductive resin composition which has both the adherent, heat resistant and moisture resistant properties of epoxy and phenolic resins and the flexible and impact resistant properties of silicone resins, is capable of fully absorbing stresses generated at the bond interface, and is suitable for use in electrical and mechanical connection of electronic parts as a substitute for the existing solder and conductive resin compositions. Another object is to provide an electronic part using the same.

The present invention provides a conductive resin composition comprising (A) an epoxy resin, (B) a phenolic resin, (C) a curing accelerator, and (D) a conductive filler as essential components. Component (A) and/or (B) is a copolymer obtained by reacting an epoxy resin or phenolic resin having at least two structural units of formula (1) per molecule:

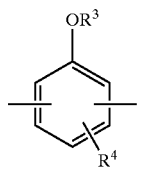
(1)

wherein $R^3$ is hydrogen or glycidyl, and $R^4$ is hydrogen or a monovalent hydrocarbon group of 1 to 6 carbon atoms, with an organopolysiloxane of average compositional formula (2):

$$(R^1)_a(R^2)_b SiO_{(4-a-b)/2} \quad (2)$$

wherein $R^1$ is a monovalent organic group containing an amino, epoxy, hydroxyl or carboxyl group, hydrogen, hydroxyl, alkoxy or alkenyloxy group, $R^2$ is a substituted or unsubstituted monovalent hydrocarbon group, letters a and b are positive numbers in the range: $0.001 \leq a \leq 1$, $1 \leq b \leq 3$, and $1 \leq a+b \leq 4$, the number of silicon atoms per molecule is an integer of 1 to 1,000, the number of functional groups $R^1$ directly attached to silicon atoms per molecule is an integer of at least 1. The organopolysiloxane component in the cured composition does not form a phase separation structure. A weight ratio of component (D) to components (A) plus (B) is in the range: $300/100 \leq D/(A+B) \leq 1500/100$.

The conductive resin composition of the invention possesses both the adherent, heat resistant and moisture resistant properties of epoxy and phenolic resins and the flexible and impact resistant properties of silicone resins, is capable of fully absorbing stresses generated at the bond interface, and is suitable for use in electrical and mechanical connection of electronic parts as a substitute for the existing solder and conductive resin compositions. The term "conductive" is electrically conductive throughout the specification.

DESCRIPTION OF THE PREFERRED EMBODIMENTS

The conductive resin composition of the invention uses (A) an epoxy resin as a base and (B) a phenolic resin as a curing agent. Either one or both of components (A) and (B) must be a silicone-modified resin, i.e., a resin modified with an organopolysiloxane.

Reference is first made to the silicone-modified resin.

The silicone-modified resin originates from an epoxy resin or phenolic resin which has at least two, preferably 2 to 10, and more preferably 2 to 5 structural units of formula (1) per molecule.

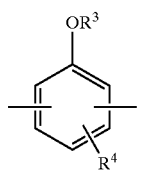
(1)

Herein $R^3$ is hydrogen or glycidyl:

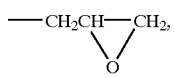

and $R^4$ is hydrogen or a monovalent hydrocarbon group of 1 to 6 carbon atoms.

At least two structural units of formula (1) are included for the following reason. When the epoxy or phenolic resin is reacted with an organopolysiloxane, either one of $R^3$ and $R^4$ in formula (1) reacts with a functional group $R^1$ in formula (2). If only one structural unit of formula (1) is included and $R^3$ reacts with the functional group $R^1$, then the epoxy or phenolic hydroxyl group is lost from the moiety of formula (1), which means that the function of epoxy or phenolic resin is lost. If only one structural unit of formula (1) is included and $R^4$ reacts with the functional group $R^1$, then both the epoxy or phenolic hydroxyl group and the organopolysiloxane are attached to the same benzene ring, indicating that reactivity lowers due to a steric factor. If two or more structural units of formula (1) are included, a controlled blending ratio of the epoxy or phenolic resin and the organopolysiloxane makes it possible that only one of the epoxy or phenolic hydroxyl group and the organopolysiloxane be attached to some benzene rings, indicating possible maintenance of reactivity. Moreover, as compared with the inclusion of one structural unit of formula (1), the inclusion of two or more structural units of formula (1) increases the number of functional groups on the silicone-modified resin and hence, the crosslinking density of cured products, which leads to improved mechanical strength, heat resistance and moisture resistance.

Of the above-described epoxy and phenolic resins, those of the following general formula (3), (4) or (5) are desirable.

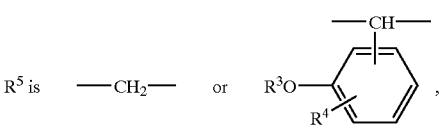

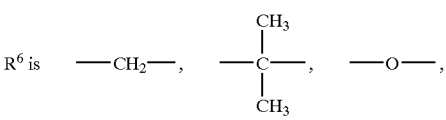

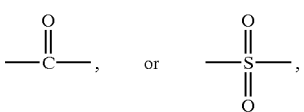

n and m each are an integer of at least 0.

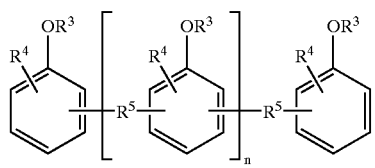

(3)

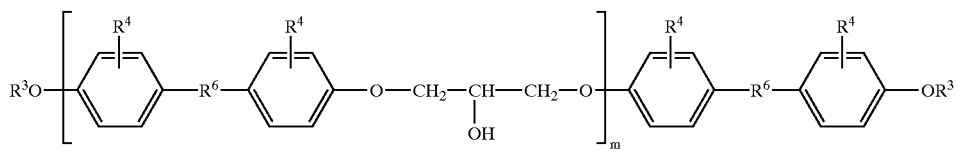

(4)

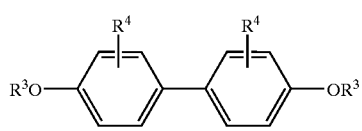

(5)

Herein $R^3$ is hydrogen or glycidyl, $R^4$ is hydrogen or a monovalent hydrocarbon group of 1 to 6 carbon atoms, Illustrative examples of the epoxy and phenolic resins of formula (3), (4) or (5) are compounds of the structure shown below.

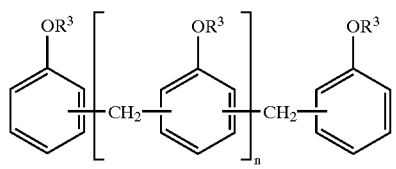

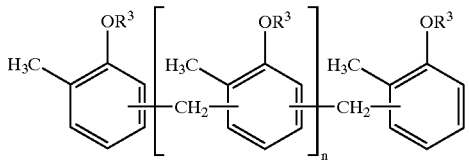

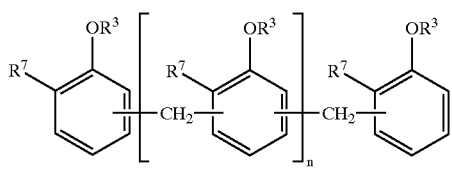

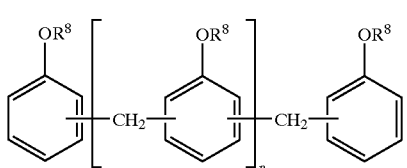

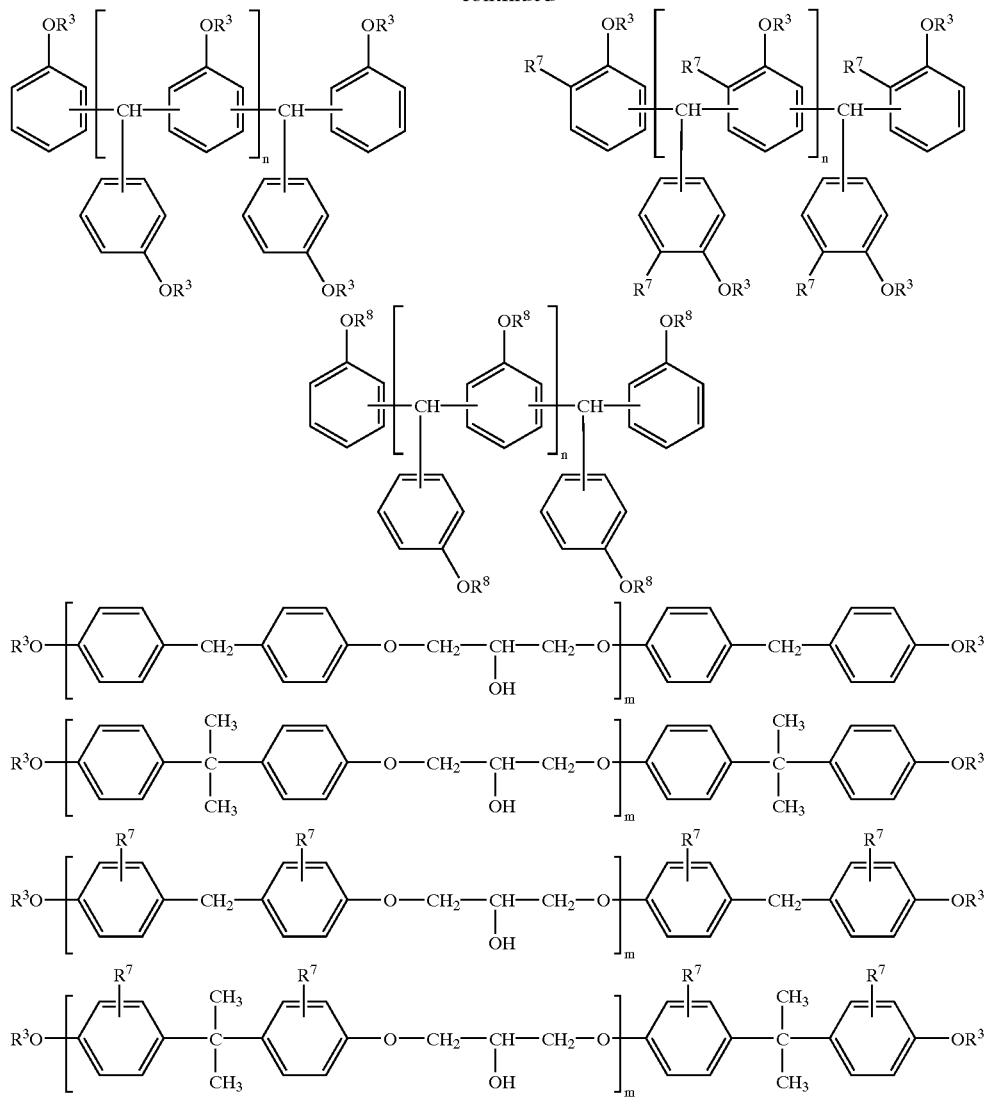

Herein R³ is hydrogen or glycidyl,

R⁷ is each independently hydrogen or an alkenyl group such as vinyl, allyl or propenyl, R⁸ is each independently

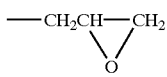

or

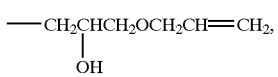

n and m each are an integer inclusive of 0.

The molecular weight of these epoxy and phenolic resins is not critical. They preferably have a lower molecular weight in order that the silicone-modified resin have a low viscosity and the resin composition be easy to work. Illustratively, n is 0 to 10, and m is 0 to 5. More preferably, n is 0 to 5 when R⁵ is —CH₂—, or 0 to 3 when R⁵ is

and m is 0 to 3.

The other reactant from which the silicone-modified resin is derived is an organopolysiloxane of the average compositional formula (2).

$$(R^1)_a(R^2)_b SiO_{(4-a-b)/2} \tag{2}$$

Herein $R^1$ is a monovalent organic group containing an amino, epoxy, hydroxyl or carboxyl group, hydrogen, hydroxyl, alkoxy or alkenyloxy group, $R^2$ is a substituted or unsubstituted monovalent hydrocarbon group, letters a and b are positive numbers in the range: $0.001 \leq a \leq 1$, $1 \leq b \leq 3$, and $1 \leq a+b \leq 4$. The number of silicon atoms per molecule is an integer of 1 to 1,000. The number of functional groups $R^1$ directly attached to silicon atoms per molecule is an integer of at least 1.

In formula (2), the amino-containing monovalent organic groups represented by $R^1$ include alkyl groups having substituted thereon an amino group or N-substituted amino group as illustrated below.

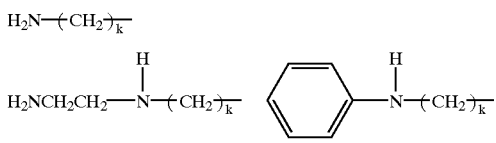

Herein k is 1, 2 or 3.

The epoxy-containing monovalent organic groups represented by $R^1$ include alkyl groups having substituted thereon a glycidyloxy or 3,4-epoxycyclohexyl group as illustrated below.

Herein k is 1, 2 or 3.

The hydroxy-containing monovalent organic groups represented by $R^1$ include alkyl groups having substituted thereon a hydroxy or hydroxyphenyl group as illustrated below.

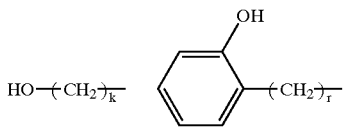

Herein k is 1, 2 or 3, and r is 0, 1, 2 or 3.

The carboxyl-containing monovalent organic groups represented by $R^1$ include alkyl groups having terminally substituted thereon a carboxyl group as illustrated below.

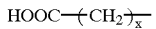

Herein x is an integer of 0 to 10.

Besides, the functional groups $R^1$ may be hydrogen, hydroxyl, alkoxy or alkenyloxy groups. The hydrogen atom or hydroxyl group bonds directly to the silicon atom to form a hydrosilyl group (SiH) or silanol group (SiOH).

The alkoxy groups represented by $R^1$ are preferably those of 1 to 8 carbon atoms, especially 1 to 4 carbon atoms. Included are straight, branched or cyclic alkoxy groups, for example, methoxy, ethoxy, iso-propoxy, n-propoxy, sec-propoxy, n-butoxy, sec-butoxy, iso-butoxy, tert-butoxy, n-pentyloxy, sec-pentyloxy, cyclopentyloxy, n-hexyloxy and cyclohexyloxy. Those groups of the following formula are preferred.

Herein k is 1, 2 or 3.

The alkenyloxy groups represented by $R^1$ are preferably those of 2 to 6 carbon atoms, especially 2 to 4 carbon atoms and include, for example, vinyloxy, propenyloxy, isopropenyloxy and isobutenyloxy.

The substituted or unsubstituted monovalent hydrocarbon groups represented by $R^2$ are preferably those of 1 to 10 carbon atoms, especially 1 to 6 carbon atoms and include, for example, alkyl groups such as methyl, ethyl, n-propyl, isopropyl, n-butyl, isobutyl, tert-butyl, pentyl, neopentyl, hexyl, cyclohexyl, octyl, and decyl, alkenyl groups such as vinyl, allyl, propenyl and butenyl, aryl groups such as phenyl and tolyl, aralkyl groups such as benzyl and phenylethyl, and halogenated monovalent hydrocarbon groups in which some or all of the hydrogen atoms on the foregoing hydrocarbon groups are substituted with halogen atoms or the like.

Letters a and b are positive numbers in the range: $0.001 \leq a \leq 1$, $1 \leq b \leq 3$, and $1 \leq a+b \leq 4$, and preferably $0.01 \leq a \leq 0.1$, $1.8 \leq b \leq 2$, and $1.85 \leq a+b \leq 2.1$. The number of silicon atoms per molecule is an integer of 1 to 1,000, preferably an integer of 2 to 100, more preferably an integer of 5 to 60. The number of functional groups $R^1$ directly attached to silicon atoms per molecule is an integer of at least 1, preferably an integer of 2 to 5, most preferably 2.

Illustrative of the organopolysiloxane are organohydrogenpolysiloxanes of formula (6), and amino, epoxy, hydroxy or carboxyl group-containing organopolysiloxanes of formula (7), both shown below.

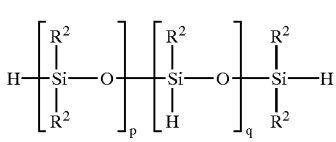

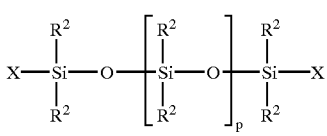

In formulae (6) and (7), $R^2$ is a substituted or unsubstituted monovalent hydrocarbon group as defined in formula (2), preferably methyl or phenyl; X is an amino, epoxy, hydroxy or carboxyl group-containing monovalent hydrocarbon group as defined for $R^1$ in formula (2). Letter p is an integer of 0 to 98, especially 3 to 58, and q is an integer of 0 to 20, especially 0 to 5.

The organopolysiloxanes shown below are illustrative of the compounds of formulae (6) and (7). It is noted that in each formula, the recurring number of siloxane units is merely exemplary and may be an arbitrary integer within the range defined for p and q.

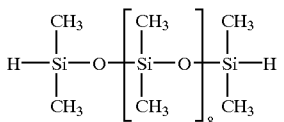

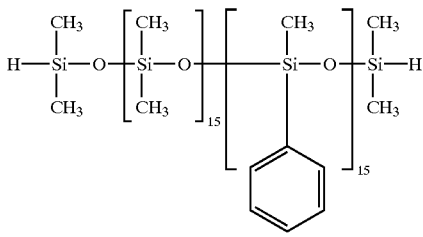

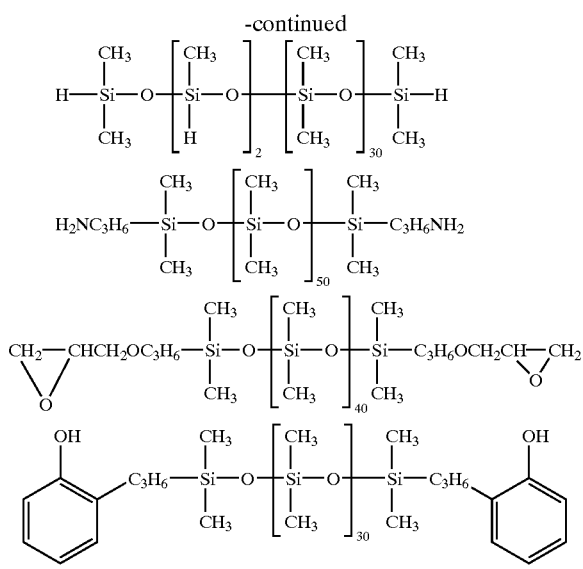

These organopolysiloxanes desirably have a molecular weight of 100 to 10,000, especially 500 to 5,000, although the molecular weight is not critical. As long as the molecular weight of the organopolysiloxane is in the above range, the cured product of the silicone-modified resin remains uniform without giving rise to phase separation and possesses both the properties (e.g., flexibility, impact resistance) of silicone resin and the properties (e.g., adhesion, heat resistance, moisture resistance) of epoxy or phenolic resin. If the molecular weight is less than 100, the cured product may become rigid and brittle. If the molecular weight is more than 10,000, phase separation may occur.

The amount of the organopolysiloxane blended is not critical and is desirably such that the content of organopolysiloxane component in the silicone-modified resin may be 80% by weight or less.

It is not critical how to prepare the silicone-modified resin used in the conductive resin composition of the invention. Any well-known method may be used. Preferably, the silicone-modified resin is prepared by effecting hydrosilylation addition reaction between the alkenyl group-containing epoxy or phenolic resin and the organopolysiloxane containing at least one silicon atom-bonded hydrogen atom (SiH group), that is, organohydrogenpolysiloxane, and specifically between alkenyl groups on the former and SiH groups on the latter.

It is essential for the conductive resin composition of the invention that the organopolysiloxane component in the cured product form no phase separation structure and remain homogeneous. The factors that govern the phase separation are two, i.e., the content of organopolysiloxane component in the silicone-modified resin (silicone-modified epoxy or phenolic resin) and the content of organopoly-siloxane component in the entire organic resin components (silicone-modified epoxy or phenolic resin plus epoxy or phenolic resin to be described later).

First, the content of organopolysiloxane component in the silicone-modified resin is desirably 80% by weight or less, more desirably 70% by weight or less. With a content of more than 80%, the organopolysiloxane component can form a phase separation structure in the silicone-modified resin, which becomes non-uniform. If this non-uniform silicone-modified resin is added to a resin composition, the organopolysiloxane component still forms a phase separation structure so that the composition becomes non-uniform.

As a result of the increased content of organopolysiloxane component, the flexible and impact resistant properties of silicone resin are maintained, but the adherent, heat resistant and moisture resistant properties of epoxy or phenolic resin are lost. The lower limit of the organopolysiloxane component content is desirably at least 10% by weight, more desirably at least 20% by weight, though not critical. With too low a content of the organopolysiloxane component, it may be difficult to control the content of the organopolysiloxane component in the entire organic resin components to an appropriate range.

Secondly, the content of the organopolysiloxane component in the entire organic resin components is desirably at least 10% by weight, more desirably at least 20% by weight. With a content of less than 10%, the organopolysiloxane component may form a phase separation structure so that the composition becomes non-uniform. As a result of the reduced content of organopolysiloxane component, the adherent, heat resistant and moisture resistant properties of epoxy or phenolic resin are maintained, but the flexible and impact resistant properties of silicone resin are lost. The upper limit of the organopolysiloxane component content in the entire organic resin components is desirably up to 80% by weight for the same reason as above, though not critical.

The viscosity and epoxy equivalent of the silicone-modified epoxy resin or the viscosity and phenolic hydroxyl equivalent of the silicone-modified phenolic resin are not critical. Depending on a particular application, a choice may be made among resins ranging from liquid to solid at room temperature. In particular, for those resin compositions which are liquid at room temperature, the silicone-modified epoxy resin should preferably have a viscosity at 25° C. of 0.01 to 100 pascal-second, especially 0.1 to 20 Pa·s, and an epoxy equivalent of 100 to 2,000, especially 200 to 1,000. The silicone-modified phenolic resin should preferably have a viscosity at 25° C. of 0.01 to 200 Pa·s, especially 0.1 to 100 Pa·s, and a phenolic hydroxyl equivalent of 100 to 2,000, especially 200 to 1,000.

In the conductive resin composition of the invention, the silicone-modified epoxy resin and the silicone-modified phenolic resin are preferably used in combination.

The amount of the silicone-modified resin in the conductive resin composition is not critical. Desirably, at least 10 parts by weight, especially at least 20 parts by weight of the organopolysiloxane is present per 100 parts by weight of the entire organic resin components (silicone-modified epoxy or phenolic resin plus epoxy or phenolic resin to be described later). An organopolysiloxane content of less than 10 parts by weight poses a possibility that the cured product become rigid and brittle, and the flexible and impact resistant properties of silicone resin be lost.

In the conductive resin composition of the invention, well-known epoxy and phenolic resins may be used as epoxy resin (A) and phenolic resin (B) in addition to the aforementioned silicone-modified resins.

The epoxy resin used herein is not limited with respect to molecular structure and molecular weight as long as it has at least two epoxy groups per molecule. A variety of well-known epoxy resins are useful. Suitable epoxy resins include bisphenol type epoxy resins such as bisphenol A epoxy resins and bisphenol F epoxy resins, novolac type epoxy resins such as phenol novolac epoxy resins and cresol novolac epoxy resins, triphenol alkane type epoxy resins and polymers thereof such as triphenol methane epoxy resins and triphenol propane epoxy resins, epoxy resins having a biphenyl skeleton, epoxy resins having a naphthalene skeleton, dicyclopentadiene-phenol novolac resins, phenol aralkyl type epoxy resins, glycidyl ester type epoxy resins, alicyclic epoxy resins, heterocyclic epoxy resins, and halogenated epoxy resins, alone or in admixture of any.

The phenolic resin used herein is preferably one having at least two phenolic hydroxyl groups per molecule. Suitable phenolic resins include bisphenol type resins such as bisphenol A resins and bisphenol F resins, novolac type resins such as phenol novolac resins and cresol novolac resins, triphenol alkane type resins such as triphenol methane resins and triphenol propane resins, resol type phenolic resins, phenol aralkyl resins, biphenyl type phenolic resins, naphthalene type phenolic resins, and cyclopentadiene type phenolic resins. These curing agents may be used alone or in admixture of any.

In the conductive resin composition, the epoxy resin (A) which is silicone-modified epoxy resin plus optional epoxy resin and the phenolic resin (B) which is silicone-modified phenolic resin plus optional phenolic resin are desirably blended in such a proportion as to satisfy $0.8 \leq$(epoxy group)/(phenolic hydroxyl group)$\leq 1.25$ and especially $0.9 \leq$(epoxy group)/(phenolic hydroxyl group)$\leq 1.1$, in equivalent ratio. Outside this equivalent ratio range, some groups may be left unreacted, adversely affecting properties of the cured product and compromising the performance of electronic parts connected therewith.

In the conductive resin composition, a curing accelerator (C) is blended to accelerate the curing reaction of the epoxy resin with the phenolic resin. The curing accelerator used herein is not critical although it is preferably selected from among basic organic compounds such as organophosphorus compounds, imidazole compounds and tertiary amine compounds. Of these, organophosphorus compounds are desirable for reliability under humid conditions.

Examples of suitable imidazole compounds include 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole, and 2-phenyl-4,5-dihydroxymethylimidazole.

Examples of suitable tertiary amine compounds include amines compounds having alkyl or aralkyl groups as the substituents attached to the nitrogen atom such as triethylamine, benzyldimethylamine, benzyltrimethylamine and α-methylbenzyldimethylamine; cycloamidine compounds and salts thereof with organic acids such as 1,8-diazabicyclo-[5.4.0]undecene-7 and its salts with phenol, octylic acid and oleic acid; and salts or complex salts of cycloamidine compounds with quaternary boron compounds such as the compound of the formula shown below.

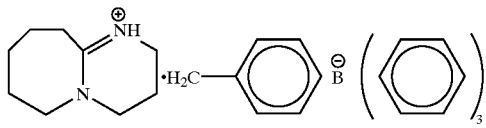

Examples of suitable organophosphorus compounds include triorganophosphines such as triphenylphosphine, tributylphosphine, tri(p-methylphenyl)phosphine and tri (nonylphenyl)phosphine; salts of triorganophosphine with triorganoboran such as triphenylphosphine-triphenylboran; and salts of tetraorganophosphonium with tetraorganoborate such as tetraphenylphosphonium tetraphenylborate.

The curing accelerator is desirably added in an amount of 0.1 to 10 parts by weight, especially 0.5 to 5 parts by weight per 100 parts by weight of the organic resin components (i.e., components (A) and (B) combined). With less than 0.1 part of the curing accelerator, the resin composition may be under-cured. More than 10 parts of the curing accelerator can compromise the shelf stability of the resin composition.

The conductive resin composition further contains (D) a conductive filler. The conductive filler is not limited with respect to material, shape and size. Suitable fillers include particles of various metals such as gold, silver, copper, tin, zinc, nickel, cobalt, iron, manganese, aluminum, molybdenum and tungsten, and alloys thereof. The shape may be spherical, granular, flaky or needle. Also useful are conductive powders in which metals as mentioned above are deposited on surfaces of insulating particles of silica, alumina, organic resin or silicone rubber by evaporation or plating. The particle size is desirably 0.1 to 100 μm, especially 1 to 50 μm.

The conductive filler (D) is blended in such an amount that a weight ratio of component (D) to components (A) plus (B) is in the range: $300/100 \leq D/(A+B) \leq 1500/100$. The preferred weight ratio is $400/100 \leq D/(A+B) \leq 1200/100$, especially $500/100 \leq D/(A+B) \leq 900/100$. A weight ratio $D/(A+B)<300/100$ may result in insufficient conductivity whereas with a weight ratio $D/(A+B)>1500/100$, the composition may be too viscous and inefficient to work and the cured product may become rigid, losing flexibility and impact resistance. It is desired that the cured product have a volume resistivity of up to $10^{-2}$ Ω·cm, especially up to $10^{-3}$ Ω·cm at room temperature.

The conductive resin composition of the invention may contain an insulating filler such as silica, alumina, talc, mica, silicon nitride or boron nitride, in addition to the aforementioned conductive filler, and other additives such as a flame retardant, ion trapping agent, wax, colorant and adhesive aid insofar as they do not compromise the objects of the invention.

Also, a solvent may be added to the conductive resin composition. Then the composition will have a low viscosity which is convenient to work, and conductivity is improved by the volume shrinkage associated with solvent removal during cure. The type and amount of the solvent are not critical. Suitable solvents include ethers such as tetrahydrofuran, 1,4-dioxane, anisole, diglyme and triglyme; ketones such as cyclohexanone, 2-butanone, methyl isobutyl ketone, methyl ethyl ketone, 2-heptanone, 2-octanone and acetophenone; esters such as butyl acetate, methyl benzoate, γ-butyrol-actone and methyl 2-hydroxypropanoate; cellosolves such as ethyl cellosolve acetate, butyl cellosolve acetate and carbitol acetate; amides such as N,N-dimethylformamide, N,N-dimethylacetamide and N-methyl-2-pyrrolidone; aromatic hydrocarbons such as toluene and xylene; and aliphatic hydrocarbons having at least 8 carbon atoms. Of these, cyclohexanone, methyl ethyl ketone, ethyl cellosolve acetate and carbitol acetate are desirable. An appropriate amount of the solvent added is 0.1 to 50 parts by weight, especially 1 to 10 parts by weight per 100 parts by weight of the conductive resin composition.

The conductive resin composition is prepared by mixing the respective components in a well-known manner. A mixer or the like may be used when the resin composition is pasty; and a roll mill, extruder or the like may be used when the resin composition is solid. By properly selecting the order of mixing and mixing conditions including time, temperature and pressure, the desired resin composition is obtainable.

The viscosity of the conductive resin composition is not critical and may be set as appropriate over a wide range from solid to liquid at room temperature, depending on a particular application. In the case of liquid resin compositions, they preferably have a viscosity of 10 to 1,000 Pa·s at 25° C.

The conductive resin composition of the invention is advantageously used in the electrical and mechanical connection of electronic parts. Any well-known method and conditions may be used in connecting electronic parts with the conductive resin composition. Appropriate heat curing conditions include a temperature of 80 to 200° C. and a time of 30 to 300 minutes.

It is essential for the conductive resin composition of the invention that the organopolysiloxane component in the cured product form no phase separation structure and remain uniform. Whether or not the organopolysiloxane component in the cured product is uniform is judged in terms of the outer appearance of the cured product. The cured product is judged uniform when it is transparent and non-uniform when it is opaque.

Since the conductive resin composition of the invention possesses both the adhesion, heat resistance and moisture resistance of epoxy or phenolic resin and the flexibility and impact resistance of silicone resin and can fully absorb stresses generated at the bond interface, it can be advantageously used in the electrical and mechanical connection of electronic parts as the substitute for the existing solder and conductive resin compositions. Using the conductive resin composition of the invention, highly reliable electronic parts are obtained.

EXAMPLE

Examples of the invention are given below by way of illustration and not by way of limitation.
[Synthesis of Silicone-modified Resin]

Synthesis Example 1

A flask equipped with an agitating blade, dropping funnel, thermometer, ester adapter and reflux condenser was charged with 42.0 g (0.10 mol) of an epoxy resin having formula (8) shown below and 168.0 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 36.3 g (0.05 mol) of an organopolysiloxane having formula (14) shown below and 145.2 g of toluene was added dropwise over about 30 minutes to the solution, which was then ripened at 100° C. for 6 hours. Removal of the toluene yielded a yellow clear liquid having a viscosity η of 5 Pa·s at 25 °C., an epoxy equivalent of 400 and an organopolysiloxane content of 46.4 parts by weight. This is designated Compound A.

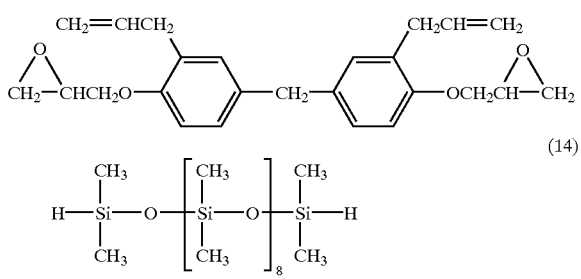

Synthesis Example 2

A flask equipped with an agitating blade, dropping funnel, thermometer, ester adapter and reflux condenser was charged with 42.0 g (0.10 mol) of an epoxy resin having formula (8) and 168.0 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 110.3 g (0.05 mol) of an organopolysiloxane having formula (15) shown below and 441.2 g of toluene was added dropwise over about 30 minutes to the solution, which was then ripened at 100° C. for 6 hours. Removal of the toluene yielded a yellow clear liquid having a viscosity η of 2 Pa·s at 25° C., an epoxy equivalent of 770 and an organopolysiloxane content of 72.4 parts by weight. This is designated Compound B.

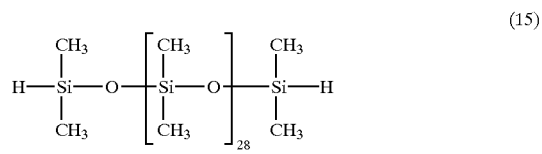

Synthesis Example 3

A flask equipped with an agitating blade, dropping funnel, thermometer, ester adapter and reflux condenser was charged with 42.0 g (0.10 mol) of an epoxy resin having formula (8) and 168.0 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 221.3 g (0.05 mol) of an organopolysiloxane having formula (16) shown below and 885.2 g of toluene was added dropwise over about 30 minutes to the solution, which was then ripened at 100° C. for 6 hours. Removal of the toluene yielded a yellow opaque liquid having a viscosity η of 1 Pa·s at 250° C., an epoxy equivalent of 770 and an organopolysiloxane content of 84.0 parts by weight. This is designated Compound C.

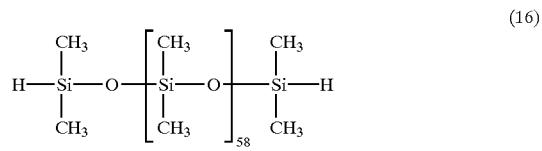

Synthesis Example 4

A flask equipped with an agitating blade, dropping funnel, thermometer, ester adapter and reflux condenser was charged with 42.0 g (0.10 mol) of an epoxy resin having formula (8) and 168.0 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 122.9 g (0.05 mol) of an organopolysiloxane having formula (17) shown below and 491.6 g of toluene was added dropwise over about 30 minutes to the solution, which was then ripened at 100° C. for 6 hours. Removal of the toluene yielded a yellow clear liquid having a viscosity η of 4 Pa·s at 25° C., an epoxy equivalent of 830 and an organopolysiloxane content of 74.5 parts by weight. This is designated Compound D.

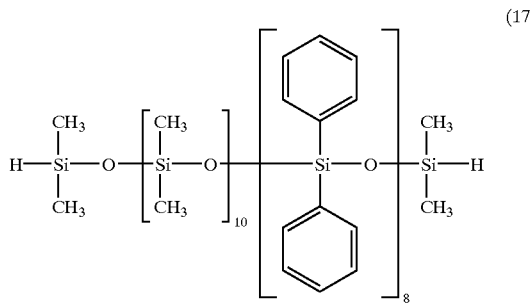

(17)

Synthesis Example 5

A flask equipped with an agitating blade, dropping funnel, thermometer, ester adapter and reflux condenser was charged with 37.8 g (0.10 mol) of an epoxy resin having formula (9) shown below and 151.2 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 36.3 g (0.05 mol) of an organopolysiloxane having formula (14) and 145.2 g of toluene was added dropwise over about 30 minutes to the solution, which was then ripened at 100° C. for 6 hours. Removal of the toluene yielded a yellow clear liquid having a viscosity η of 3 Pa·s at 25° C., an epoxy equivalent of 370 and an organopolysiloxane content of 49.0 parts by weight. This is designated Compound E.

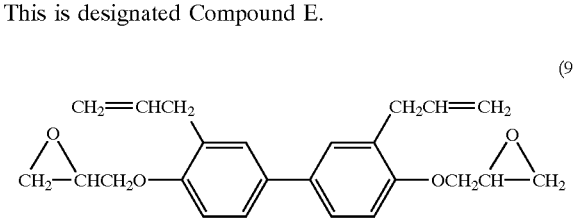

(9)

Synthesis Example 6

A flask equipped with an agitating blade, dropping funnel, thermometer, ester adapter and reflux condenser was charged with 58.0 g (0.10 mol) of an epoxy resin having formula (10) shown below and 232.0 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 110.3 g (0.05 mol) of an organopolysiloxane having formula (15) and 441.2 g of toluene was added dropwise over about 30 minutes to the solution, which was then ripened at 100° C. for 6 hours. Removal of the toluene yielded a yellow clear liquid having a viscosity η of 5 Pa·s at 25° C., an epoxy equivalent of 850 and an organopolysiloxane content of 65.5 parts by weight. This is designated Compound F.

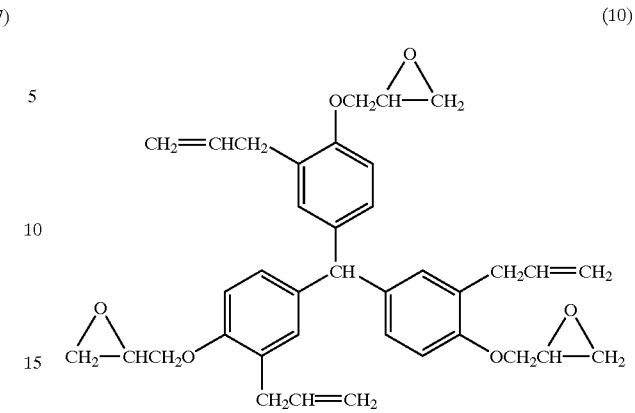

(10)

Synthesis Example 7

A flask equipped with an agitating blade, dropping funnel, thermometer, ester adapter and reflux condenser was charged with 30.8 g (0.10 mol) of a phenolic resin having formula (11) shown below and 123.2 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 36.3 g (0.5 mol) of an organopolysiloxane having formula (14) and 145.2 g of toluene was added dropwise over about 30 minutes to the solution, which was then ripened at 100° C. for 6 hours. Removal of the toluene yielded a brown clear liquid having a viscosity η of 20 Pa·s at 25° C., a phenol equivalent of 340 and an organopolysiloxane content of 54.1 parts by weight. This is designated Compound G.

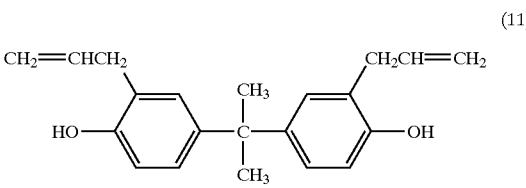

(11)

Synthesis Example 8

A flask equipped with an agitating blade, dropping funnel, thermometer, ester adapter and reflux condenser was charged with 30.8 g (0.10 mol) of a phenolic resin having formula (11) and 123.2 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 110.3 g (0.05 mol) of an organopolysiloxane having formula (15) and 441.2 g of toluene was added dropwise over about 30 minutes to the solution, which was then ripened at 100° C. for 6 hours. Removal of the toluene yielded a brown clear liquid having a viscosity η of 10 Pa·s at 25° C., a phenol equivalent of 720 and an organopolysiloxane content of 78.2 parts by weight. This is designated Compound H.

Synthesis Example 9

A flask equipped with an agitating blade, dropping funnel, thermometer, ester adapter and reflux condenser was charged with 30.8 g (0.10 mol) of a phenolic resin having formula (11) and 123.2 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 221.3 g (0.05 mol) of an organopolysiloxane having formula (16) and 885.2 g of toluene was added dropwise over about 30 minutes to the solution, which was then ripened at 100° C. for 6 hours. Removal of the toluene yielded a brown opaque liquid having a viscosity η of 6 Pa·s at 25° C., a phenol equivalent of 720 and an organopolysiloxane content of 87.8 parts by weight. This is designated Compound I.

Synthesis Example 10

A flask equipped with an agitating blade, dropping funnel, thermometer, ester adapter and reflux condenser was charged with 30.8 g (0.10 mol) of a phenolic resin having formula (11) and 123.2 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 122.9 g (0.05 mol) of an organopolysiloxane having formula (17) and 491.6 g of toluene was added dropwise over about 30 minutes to the solution, which was then ripened at 100° C. for 6 hours. Removal of the toluene yielded a brown clear liquid having a viscosity η of 16 Pa·s at 25° C., a phenol equivalent of 770 and an organopolysiloxane content of 80.0 parts by weight. This is designated Compound J.

Synthesis Example 11

A flask equipped with an agitating blade, dropping funnel, thermometer, ester adapter and reflux condenser was charged with 26.6 g (0.10 mol) of a phenolic resin having formula (12) shown below and 106.4 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 36.3 g (0.05 mol) of an organopolysiloxane having formula (14) and 145.2 g of toluene was added dropwise over about 30 minutes to the solution, which was then ripened at 100° C. for 6 hours. Removal of the toluene yielded a brown clear liquid having a viscosity η of 12 Pa·s at 25° C., a phenol equivalent of 315 and an organopolysiloxane content of 58.1 parts by weight. This is designated Compound K.

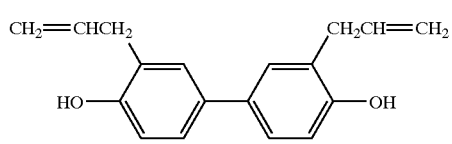

(12)

Synthesis Example 12

A flask equipped with an agitating blade, dropping funnel, thermometer, ester adapter and reflux condenser was charged with 41.2 g (0.10 mol) of a phenolic resin having formula (13) shown below and 164.8 g of toluene, after which water was azeotroped off at 130° C. for 2 hours. To the flask cooled to 100° C., 0.5 g of a catalyst (CAT-PL-50T by Shin-Etsu Chemical Co., Ltd.) was added dropwise. Immediately thereafter, a mixture of 110.3 g (0.05 mol) of an organopolysiloxane having formula (15) and 441.2 g of toluene was added dropwise over about 30 minutes to the solution, which was then ripened at 100° C. for 6 hours. Removal of the toluene yielded a brown clear liquid having a viscosity η of 20 Pa·s at 25° C., a phenol equivalent of 760 and an organopolysiloxane content of 72.8 parts by weight.

This is designated Compound L.

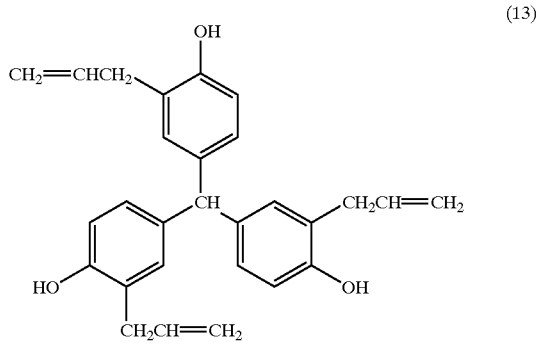

(13)

[Preparation of Electronic Part Adhesives]

Examples 1–7 & Comparative Examples 1–3

Conductive resin compositions were prepared by blending Compound A, B, C, D, E, F, G, H, I, J, K or L, a bisphenol A epoxy resin M (η=15 Pa·s/25° C., epoxy equivalent 180), a phenol novolac resin N (softening point 55° C., phenol equivalent 100), TPP (triphenylphosphine), silver powder (flakes, average particle size 5 μm), KBM-403 (Shin-Etsu Chemical Co., Ltd., silane coupling agent, γ-glycidoxypropyltrimethoxysilane), and a solvent (ethyl cellosolve acetate) as shown in Tables 1 and 2, mixing them in a mixer. These conductive resin compositions were examined by tests (a) to (h) described below, with the results being also shown in Tables 1 and 2. The organopolysiloxane content was computed from the content in the modified resin of each Synthesis Example. Curing conditions included 100° C., 5 minutes plus 150° C., 1 hour.

(a) Appearance of Cured Product

A similar composition having the formulation of Tables 1–2, but excluding silver powder and KBM-403 was formed into a film sample of 1 mm thick, whose outer appearance was visually observed. A clear looking sample was uniform without a phase separation structure whereas an opaque looking sample indicated the formation of a phase separation structure.

(b) Tg of Cured Product

Using a thermomechanical analyzer (TMA), a specimen of 5 mm×5 mm×15 mm was heated at a rate of 5° C./min whereby the glass transition temperature (Tg) was determined.

(c) Moisture Absorption of Cured Product

A disk specimen having a diameter of 50 mm and a height of 3 mm was allowed to stand at 121° C., 100% RH and 2 atm for 72 hours. A weight change before and after the test was determined.

(d) Tensile Modulus of Cured Product

Tensile modulus at 25° C. was measured according to JIS K7113.

(e) Volume Resistivity of Cured Product

Volume resistivity (ρv) at 25° C. was measured according to JIS K6911.

(f) Impact Resistance

A 1-mg portion of the conductive resin composition (Tables 1–2) was applied to a glass plate of 30 mm×50 mm×1 mm at its center, and dried at 100° C. for 5 minutes. A silicon chip of 7 mm×7 mm×0.3 mm was mounted thereon. Curing at 150° C. for 1 hour completed a test piece. Twenty test pieces, with the silicon chip faced down, were dropped 10, 30 or 100 times from a height of 1.5 m to a concrete floor. The number of broken test pieces per overall test pieces was reported.

(g) Thermal Cycling

The conductive resin composition (Tables 1–2) was applied to a copper frame (150 μm thick) to 20 mm×20 mm×50 μm and dried at 100° C. for 5 minutes. A silicon chip of 20 mm×20 mm×0.3 mm was mounted thereon. Curing at 150° C. for 1 hour completed a test piece. Twenty test pieces were subjected 10, 30 or 100 cycles to a thermal cycling test consisting of 240° C. solder bath for 10 seconds and liquefied nitrogen for 10 seconds. The number of cracked or separated test pieces per overall test pieces was reported.

(h) Chip Warpage

Twenty test pieces were prepared as in test (g). The height of the chip surface was measured. An average of difference in height between the center and four corners was computed.

TABLE 1

| Component (pbw) | | Example 1 | Example 2 | Example 3 | Example 4 | Example 5 | Example 6 |
|---|---|---|---|---|---|---|---|
| Compound A | | 54.1 | 0 | 0 | 0 | 0 | 30.8 |
| Compound B | | 0 | 51.7 | 0 | 0 | 0 | 0 |
| Compound C | | 0 | 0 | 0 | 0 | 0 | 0 |
| Compound D | | 0 | 0 | 51.9 | 0 | 0 | 0 |
| Compound E | | 0 | 0 | 0 | 54.0 | 0 | 0 |
| Compound F | | 0 | 0 | 0 | 0 | 52.8 | 0 |
| Compound G | | 45.9 | 0 | 0 | 0 | 0 | 26.2 |
| Compound H | | 0 | 48.3 | 0 | 0 | 0 | 0 |
| Compound I | | 0 | 0 | 0 | 0 | 0 | 0 |
| Compound J | | 0 | 0 | 48.1 | 0 | 0 | 0 |
| Compound K | | 0 | 0 | 0 | 46.0 | 0 | 0 |
| Compound L | | 0 | 0 | 0 | 0 | 47.2 | 0 |
| Epoxy resin M | | 0 | 0 | 0 | 0 | 0 | 24.6 |
| Phenolic resin N | | 0 | 0 | 0 | 0 | 0 | 18.4 |
| TPP | | 1 | 1 | 1 | 1 | 1 | 1 |
| Ag powder | | 714 | 714 | 714 | 714 | 714 | 714 |
| KBM-403 | | 1 | 1 | 1 | 1 | 1 | 1 |
| Solvent | | 43 | 43 | 43 | 43 | 43 | 43 |
| Siloxane content | | 49.9 | 75.2 | 77.2 | 53.0 | 69.0 | 27.4 |
| (a) Appearance | | clear | clear | clear | clear | clear | clear |
| (b) Tg (° C.) | | −2 | −38 | −6 | −13 | −20 | 17 |
| (c) Moisture absorption (%) | | 0.43 | 0.22 | 0.15 | 0.38 | 0.34 | 0.60 |
| (d) Tensile modulus (MPa) | | 35 | 15 | 30 | 27 | 23 | 160 |
| (e) ρv ($10^{-4}$ Ω · cm) | | 1.8 | 1.0 | 1.4 | 1.2 | 1.1 | 1.9 |
| (f) Impact | 10 times | 0/20 | 0/20 | 0/20 | 0/20 | 0/20 | 0/20 |
| resistance | 30 times | 0/20 | 0/20 | 0/20 | 0/20 | 0/20 | 0/20 |
| | 100 times | 0/20 | 0/20 | 0/20 | 0/20 | 0/20 | 0/20 |
| (g) Thermal | 10 cycles | 0/20 | 0/20 | 0/20 | 0/20 | 0/20 | 0/20 |
| cycling | 30 cycles | 0/20 | 0/20 | 0/20 | 0/20 | 0/20 | 0/20 |
| | 100 cycles | 0/20 | 0/20 | 0/20 | 0/20 | 0/20 | 0/20 |
| (h) Warpage (μm) | | 23 | 32 | 22 | 21 | 18 | 35 |

TABLE 2

| Component (pbw) | | Example 7 | Comparative Example 1 | Comparative Example 2 | Comparative Example 3 |
|---|---|---|---|---|---|
| Compound A | | 13.4 | 5.0 | 0 | 35.7 |
| Compound B | | 0 | 0 | 0 | 0 |
| Compound C | | 0 | 0 | 69.4 | 0 |
| Compound D | | 0 | 0 | 0 | 0 |
| Compound E | | 0 | 0 | 0 | 0 |
| Compound F | | 0 | 0 | 0 | 0 |
| Compound G | | 11.4 | 4.2 | 30.6 | 0 |
| Compound H | | 0 | 0 | 0 | 0 |
| Compound I | | 0 | 0 | 0 | 64.3 |
| Compound J | | 0 | 0 | 0 | 0 |
| Compound K | | 0 | 0 | 0 | 0 |
| Compound L | | 0 | 0 | 0 | 0 |
| Epoxy resin M | | 48.4 | 58.4 | 0 | 0 |
| Phenolic resin N | | 26.8 | 32.4 | 0 | 0 |
| TPP | | 1 | 1 | 1 | 1 |
| Ag powder | | 714 | 714 | 714 | 714 |
| KBM-403 | | 1 | 1 | 1 | 1 |
| Solvent | | 43 | 43 | 43 | 43 |
| Siloxane content | | 12.4 | 4.6 | 74.9 | 73.0 |
| (a) Appearance | | clear | opaque | opaque | opaque |
| (b) Tg (° C.) | | 46 | 81 | −45 | −32 |
| (c) Moisture absorption (%) | | 0.79 | 0.91 | 1.12 | 1.03 |
| (d) Tensile modulus (MPa) | | 550 | 2100 | 6 | 8 |
| (e) ρv ($10^{-4}$ Ω · cm) | | 2.3 | 2.5 | 0.9 | 0.8 |
| (f) Impact | 10 times | 0/20 | 0/20 | 0/20 | 0/20 |
| resistance | 30 times | 0/20 | 0/20 | 2/20 | 0/20 |
| | 100 times | 0/20 | 1/20 | 7/20 | 3/20 |
| (g) Thermal | 10 cycles | 0/20 | 11/20 | 0/20 | 0/20 |
| cycling | 30 cycles | 0/20 | 18/20 | 0/20 | 0/20 |
| | 100 cycles | 0/20 | 20/20 | 1/20 | 2/20 |
| (h) Warpage (μm) | | 48 | 96 | 53 | 42 |

The conductive resin composition of the invention is advantageously used in the electrical and mechanical connection of electronic parts as the substitute for the existing solder and conductive resin compositions. It possesses both the adherent, heat resistant and moisture resistant properties of epoxy or phenolic resin and the flexible and impact resistant properties of silicone resin and thus can fully absorb stresses generated at the bond interface. Electronic parts connected with the conductive resin composition remain highly reliable.

Japanese Patent Application No. 2001-269998 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A conductive resin composition comprising (A) an epoxy resin, (B) a phenolic resin, (C) a curing accelerator, and (D) a conductive filler, wherein component (A) and/or (B) is a copolymer obtained by reacting an epoxy resin or phenolic resin having at least two structural units of formula (1) per molecule:

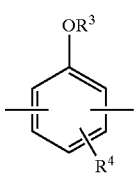

(1)

wherein $R^3$ is hydrogen or glycidyl, and $R^4$ is hydrogen or a monovalent hydrocarbon group of 1 to 6 carbon atoms, with an organopolysiloxane of average compositional formula (2):

wherein $R^1$ is a monovalent organic group containing an amino, epoxy, hydroxyl or carboxyl group, hydrogen, hydroxyl, alkoxy or alkenyloxy group, $R^2$ is a substituted or unsubstituted monovalent hydrocarbon group, letters a and b are positive numbers in the range: $0.001 \leq a \leq 1$, $1 \leq b \leq 3$, and $1 \leq a+b \leq 4$, the number of silicon atoms per molecule is an integer of 1 to 1,000, the number of functional groups $R^1$ directly attached to silicon atoms per molecule is an integer of at least 1, the organopolysiloxane component in the cured composition does not form a phase separation structure, and a weight ratio of component (D) to components (A) plus (B) is in the range: $300/100 \leq D/(A+B) \leq 1500/100$.

2. The conductive resin composition of claim 1 wherein the epoxy resin or phenolic resin having at least two structural units of formula (1) per molecule has the following general formula (3), (4) or (5):

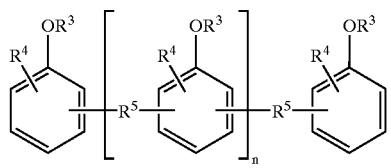

(3)

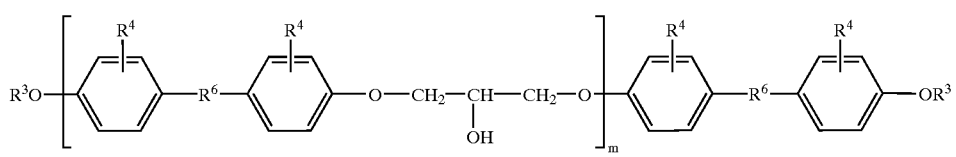

(4)

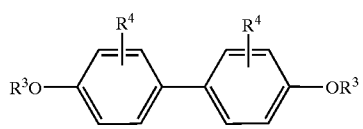

(5)

wherein $R^3$ is hydrogen or glycidyl, $R^4$ is hydrogen or a monovalent hydrocarbon group of 1 to 6 carbon atoms, $R^5$ is —$CH_2$— or

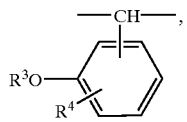

$R^6$ is —$CH_2$—,

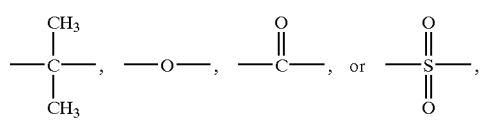

n and m each are an integer of at least 0.

3. The conductive resin composition of claim 1 which is an adhesive for electronic parts.

4. An electronic part connected with the cured conductive resin composition of claim 3.

5. The conductive resin composition of claim 1 wherein the epoxy resin or phenolic resin having at least two structural units of formula (1) per molecule is selected from the group consisting of:

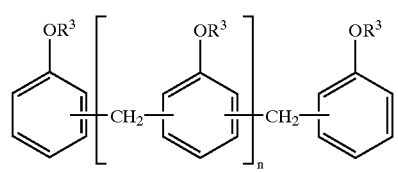
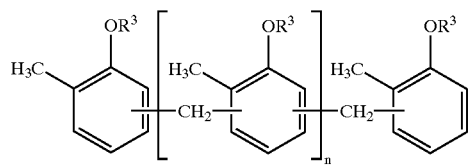
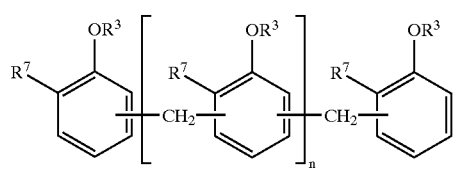
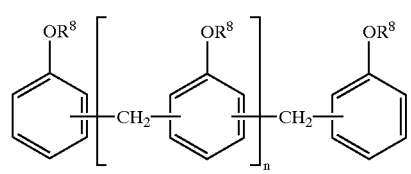

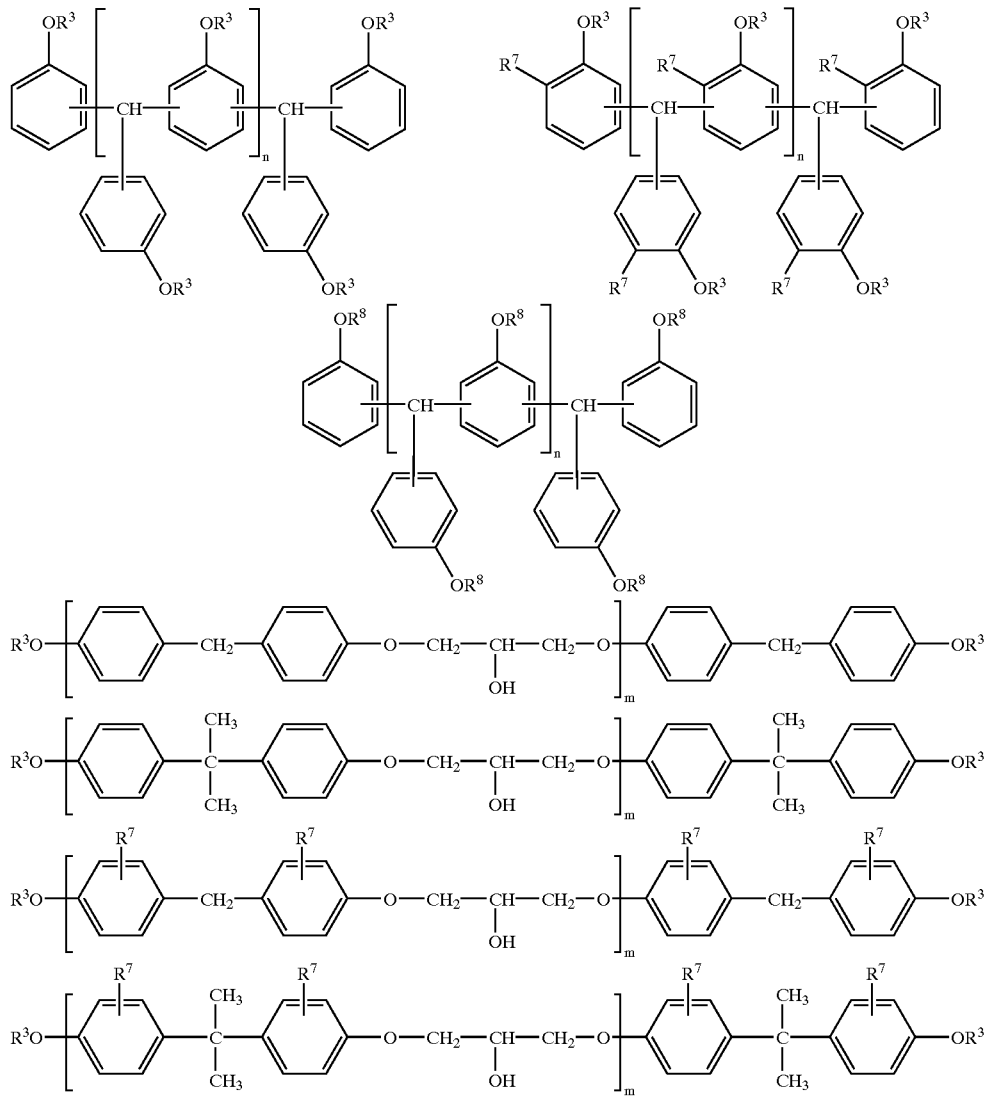
wherein R³ is hydrogen or glycidyl
R⁷ is each independently hydrogen or an alkenyl group such as vinyl, allyl or propenyl,
R⁸ is each independently
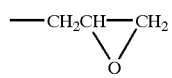
or
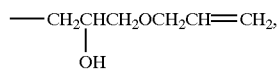
n and m each are an integer inclusive of 0.
6. The conductive resin composition of claim 1 wherein R¹ in formula (2) is selected from the group consisting of
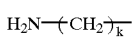
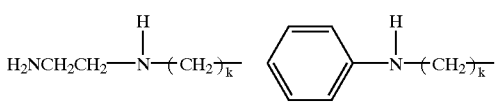
wherein k is 1, 2, or 3;
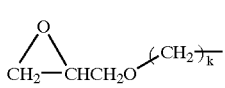 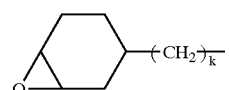
wherein k is 1, 2, or 3;

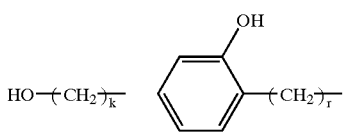

wherein k is 1, 2, or 3;

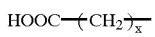

wherein x is an integer of 0 to 10; and

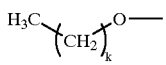

wherein k is 1, 2, or 3.

7. The conductive resin composition of claim 1 wherein $R^2$ in formula (2) is selected from the group consisting of methyl, ethyl, n-propyl, isopropyl, n-butyl, isobutyl, tert-butyl, pentyl, neopentyl, hexyl, cyclohexyl, octyl, decyl, vinyl, allyl, propenyl, butenyl, phenyl, tolyl, benzyl and phenylethyl.

8. The conductive resin composition of claim 1 wherein the letters a and b in formula (2) are positive numbers in the range: $0.01 \leq a \leq 0.1$, $1.8 \leq b \leq 2$, and $1.85 \leq a+b \leq 2.1$.

9. The conductive resin composition of claim 1 wherein the weight ratio of component (D) to components (A) plus (B) is in the range: $400/100 \leq D/(A+B) \leq 1200/100$.

10. The conductive resin composition of claim 1 wherein the weight ratio of component (D) to components (A) plus (B) is in the range: $500/100 \leq D/(A+B) \leq 900/100$.

* * * * *